United States Patent
Xiong et al.

(10) Patent No.: US 9,479,161 B2
(45) Date of Patent: Oct. 25, 2016

(54) POWER CIRCUIT AND ELECTRONIC DEVICE UTILIZING THE SAME

(71) Applicant: ShenZhen Treasure City Technology Co., LTD., ShenZhen (CN)

(72) Inventors: Jin-Liang Xiong, Wuhan (CN); Yong-Zhao Huang, Wuhan (CN)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 73 days.

(21) Appl. No.: 14/582,515

(22) Filed: Dec. 24, 2014

(65) Prior Publication Data

US 2016/0149570 A1    May 26, 2016

(30) Foreign Application Priority Data

Nov. 20, 2014  (CN) .......................... 2014 1 0666852

(51) Int. Cl.
| | |
|---|---|
| *H03K 17/687* | (2006.01) |
| *H03K 17/567* | (2006.01) |
| *H03K 17/06* | (2006.01) |
| *H03K 17/693* | (2006.01) |
| *H03K 17/10* | (2006.01) |

(52) U.S. Cl.
CPC ........ *H03K 17/6871* (2013.01); *H03K 17/567* (2013.01); *H03K 17/063* (2013.01); *H03K 17/102* (2013.01); *H03K 17/687* (2013.01); *H03K 17/693* (2013.01); *H03K 2217/0054* (2013.01)

(58) Field of Classification Search
None
See application file for complete search history.

(56) References Cited

U.S. PATENT DOCUMENTS

| | | | | |
|---|---|---|---|---|
| 8,410,842 | B1* | 4/2013 | Bai ........................... | G06F 1/26 327/427 |
| 8,476,960 | B1* | 7/2013 | Zhou ...................... | G06F 13/385 327/379 |
| 2006/0103361 | A1* | 5/2006 | Jiang ....................... | G05F 1/565 323/273 |
| 2010/0314938 | A1* | 12/2010 | Huang ...................... | H02J 1/08 307/28 |
| 2012/0139614 | A1* | 6/2012 | Hou ...................... | H03K 17/693 327/427 |
| 2013/0057064 | A1* | 3/2013 | Xiong ....................... | H02J 9/06 307/10.1 |

* cited by examiner

Primary Examiner — Tuan T Lam
(74) Attorney, Agent, or Firm — Zhigang Ma

(57) ABSTRACT

A power circuit for an electronic device includes an input terminal, an output terminal, a voltage transform unit, and a control unit. The control unit controls the voltage transform unit to operate or not operate, according to the input terminal receives a first voltage or a second voltage. The first voltage is transformed to an output voltage, and is output by the output terminal, when the input terminal receives the first voltage. The second voltage is transmitted from the input terminal to the output terminal through the third switch unit, when the input terminal receives the second voltage. Therefore, the power circuit can receive the first voltage or the second voltage through the input terminal, and outputs the output voltage to other electronic components.

10 Claims, 2 Drawing Sheets

POWER CIRCUIT AND ELECTRONIC DEVICE UTILIZING THE SAME

FIELD

The subject matter herein generally relates to a power circuit and an electronic device utilizing the power circuit.

BACKGROUND

Some electronic devices use a dual output power supply as the power source. However, the double output power supply has two similar power connectors, which is troublesome to operate for users.

Therefore, there is need for improvement in the art.

BRIEF DESCRIPTION OF THE DRAWINGS

Implementations of the present technology will now be described, by way of example only, with reference to the attached figures.

DETAILED DESCRIPTION

Figure 1:
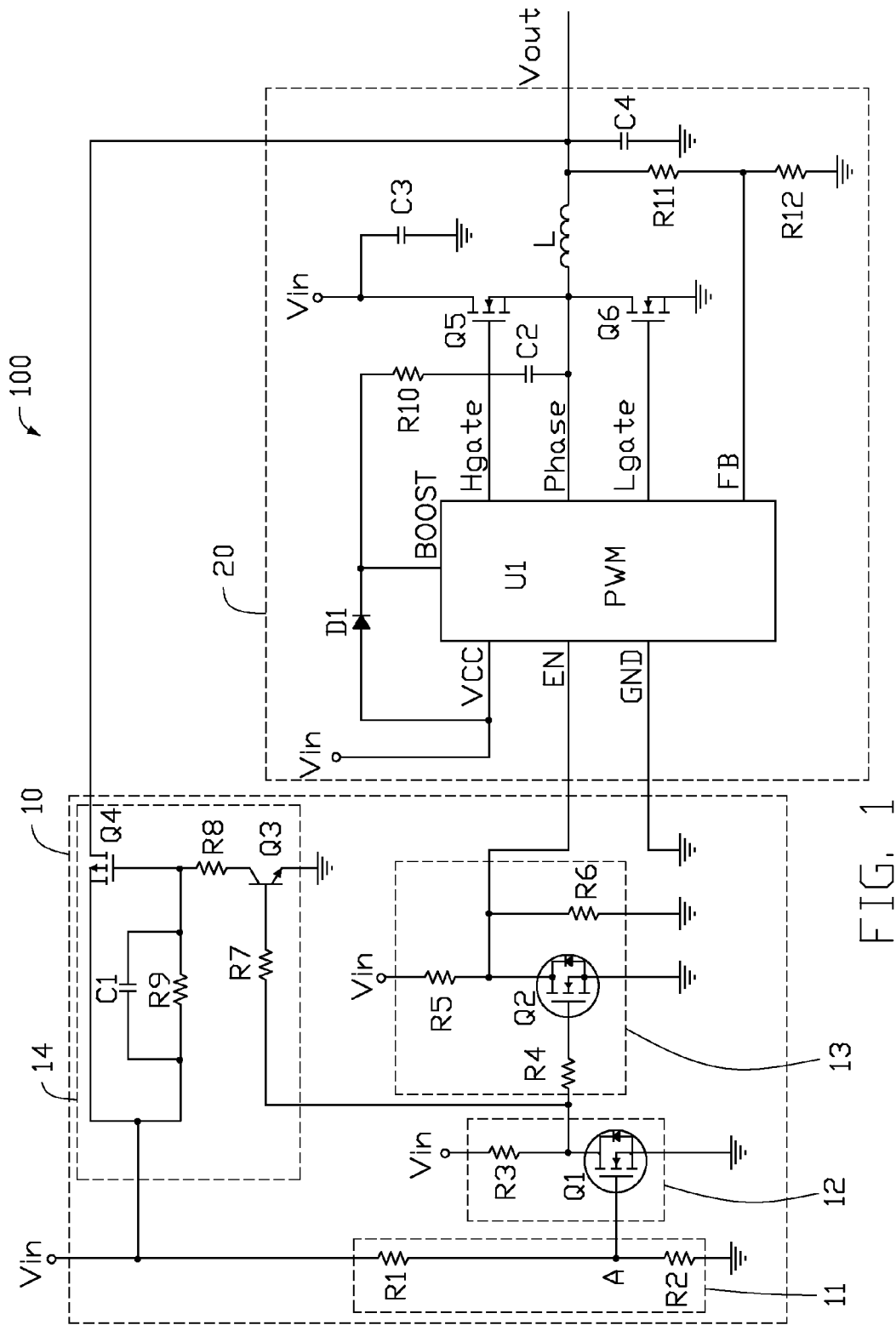
FIG. 1 is a circuit diagram of an example embodiment of a power circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series and the like.

The disclosure will now be described in relation to a power circuit.

Figure 2:
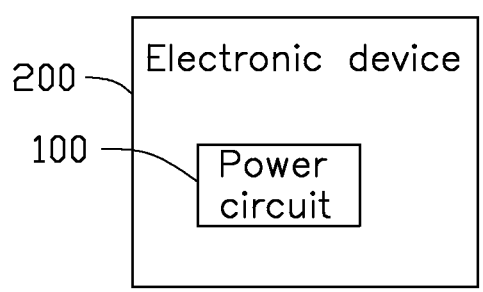
FIG. 2 is a block diagram of an embodiment of the power circuit of FIG. 1, together with an electronic device.

FIGS. 1 and 2 illustrate a circuit diagram of an example embodiment of a power circuit 100 applied in an electronic device 200. The electronic device 200 can be a power supply unit or a motherboard.

In the embodiment, the power circuit 100 includes a control unit 10, a voltage transform unit 20, an input terminal Vin, and an output terminal Vout. In this embodiment, the power circuit 100 receives a first voltage or a second voltage from a dual output power supply through the input terminal Vin, and outputs an output voltage for other electronic components.

The control unit 10 includes a voltage division unit 11, a first switch unit 12, a second switch unit 13, and a third switch unit 14. The voltage division unit 11 includes resistors R1, R2. The first switch unit 12 includes an electronic switch Q1 and a resistor R3. The second switch unit 13 includes an electronic switch Q2 and resistors R4, R5, R6. The third switch unit 14 includes electronic switches Q3, Q4, resistors R7, R8, R9, and a capacitor C1.

In this embodiment, the electronic switches Q1, Q2 are n-channel metal oxide semiconductor field-effect transistors (MOSFETs). The electronic switch Q3 is a NPN bipolar junction transistor (BJT). The electronic switch Q4 is a p-channel metal oxide semiconductor field-effect transistor (MOSFET). A first terminal of the resistor R1 is coupled to the input terminal Vin. A second terminal of the resistor R1 is coupled to a first terminal of the resistor R2. A second terminal of the resistor R2 is grounded. A gate of the MOSFET Q1 is coupled to a node A between the resistors R1 and R2. A source of MOSFET Q1 is grounded. A drain of the MOSFET Q1 is coupled to the input terminal Vin through the resistor R3. The drain of the MOSFET Q1 is also coupled to a gate of the MOSFET Q2 through the resistor R4. A source of the MOSFET Q2 is grounded. A drain of the MOSFET Q2 is coupled to the input terminal Vin through the resistor R5. The drain of the MOSFET Q2 is also grounded through the resistor R6. A base of the BJT Q3 is coupled to the drain of the MOSFET Q1 through the resistor R7. An emitter of the BJT Q3 is grounded. A collector of the BJT Q3 is coupled to a gate of the MOSFET Q4 through the resistor R8. The gate of the MOSFET Q4 is also coupled to the input terminal Vin through the resistor R9. The capacitor C1 is coupled to the resistors R9 in parallel. A source of the MOSFET Q4 is coupled to the input terminal Vin. A drain of the MOSFET Q4 is coupled to the output terminal Vout.

The voltage transform unit 20 includes a pulse-width modulation (PWM) chip U1, electronic switches Q5, Q6, an inductor L, capacitors C2, C3, C4, resistors R10, R11, R12, and a diode D1. The electronic switches Q5, Q6 are n-channel metal oxide semiconductor field-effect transistors (MOSFETs). A power pin VCC of the PWM chip U1 is coupled to the input terminal Vin, and is coupled to a bootstrap pin BOOST of the PWM chip U1 through the diode D1. An anode of the diode D1 is coupled to the power pin VCC. A cathode of the diode D1 is coupled to the bootstrap pin BOOST. The bootstrap pin BOOST is also coupled to a phase pin Phase of the PWM chip U1 through the resistor R10 and the capacitor C2. An enable pin EN of the PWM chip U1 is coupled to the drain of the MOSFET Q2. A ground pin of the PWM chip U1 is grounded. A high level driving pin Hgate of the PWM chip U1 is coupled to a gate of the MOSFET Q5. A low level driving pin Lgate of the PWM chip U1 is coupled to a gate of the MOSFET Q6. A drain of the MOSFET Q5 is coupled to the input terminal Vin. A source of the MOSFET Q5 is coupled to a drain of the MOSFET Q6. A source of the MOSFET Q6 is grounded. The phase pin Phase is grounded through the inductor L, the resistors R11 and R12. The phase pin Phase is also grounded through the inductor L and the capacitor C4. A node between the inductor L and the resistor R11 is coupled to the output terminal Vout of the power circuit 100. A feedback pin FB of the PWM chip U1 is coupled to a node between the resistors R11 and R12.

In this embodiment, the first and second voltages are 19 volts and 12Vs respectively, and the output voltage at the output terminal Vout is 12Vs. In other embodiments, the first voltage can be 24V.

In use, when the input terminal Vin receives the first voltage such as 19V, the node A between the resistors R1 and R2 outputs a divided voltage to the gate of the MOSFET Q1. The MOSFET Q1 is turned on, and the MOSFET Q2 is turned off. The enable pin EN of the PWM chip U1 receives a digital high level signal. The PWM chip U1 starts operating, and controls the MOSFETs Q5 and Q6 to turn on alternately. The output terminal Vout outputs 12V voltage.

When the input terminal Vin receives the second voltage (12Vs), the node A between the resistors R1 and R2 outputs a divided voltage to the gate of the MOSFET Q1. The MOSFET Q1 is turned off. The MOSFETs Q2, Q4, and BJT Q3 is turned on. The enable pin EN of the PWM chip U1 receives a digital low level signal. The voltage transform unit 20 does not operate. The output terminal Vout receives and outputs the 12Vs voltage from the input terminal Vin through the MOSFET Q4.

Therefore, the power circuit 100 can receive the first voltage (19V) or the second voltage (12V) through the input terminal functioning as a power supply port of the electronic device, and outputs the output voltage (12V) to other electronic components. The power circuit 10 can not only save the power supply port of the electronic device, but also can prevent damage to the components due to improper connecting power connectors.

While the disclosure has been described by way of example and in terms of the embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A power circuit comprising:
    an input terminal receiving a first voltage or a second voltage;
    an output terminal;
    a first switch unit, a second switch unit, and a third switch unit;
    a control unit comprising a voltage division unit coupled to the input terminal and the first switch unit, the second switch unit, and the third switch unit,
    the voltage division unit receiving the first voltage or the second voltage and outputting a divided voltage to the first switch unit, the first switch unit controlling the second switch unit to output a first drive signal or a second drive signal, and controlling the third switch unit to turn on/off, the third switch unit coupled between the input terminal and the output terminal; and
    a voltage transform unit coupled between the input terminal and the output terminal, and coupled to the second switch unit of the control unit;
    wherein when the input terminal receives the first voltage, the first switch unit is turned on, the third switch unit is turned off, the second switch unit outputs the first drive signal to the voltage transform unit, the voltage transform unit transforms the first voltage to an output voltage, and the output voltage is output by the output terminal;
    when the input terminal receives the second voltage, the first switch unit is turned off, the third switch unit is turned on, the second switch unit outputs the second drive signal to the voltage transform unit, the voltage transform unit cannot operate, and the second voltage from the input terminal is output by the output terminal through the third switch unit.

2. The power circuit of claim 1, wherein the voltage division unit comprises a first resistor and a second resistor, a first terminal of the first resistor is coupled to the input terminal of the power circuit, a second terminal of the first resistor is coupled to a first terminal of the second resistor, a second terminal of the second resistor is grounded, and a node between the first and second resistor is coupled to the first switch unit.

3. The power circuit of claim 2, wherein the first switch unit comprises a first electronic switch and a third resistor, a first end of the first electronic switch is coupled to the node between the first and second resistors, a second end of the first electronic switch is grounded, a third end of the electronic switch is coupled to the input terminal of the power circuit through the third resistor, and is coupled to the second switch unit.

4. The power circuit of claim 3, wherein the second switch unit comprises a second electronic switch, a fourth resistor, a fifth resistor, and a sixth resistor, a first end of the second electronic switch is coupled to the third end of the first electronic switch through the fourth resistor, a second end of the second electronic switch is grounded, a third end of the second electronic switch is coupled to the input terminal of the power circuit through the fifth resistor, and is grounded through the sixth resistor, the third end of the second electronic switch functions as an output of the second switch unit, and is coupled to the voltage transform unit.

5. The power circuit of claim 4, wherein the third switch unit comprises third and fourth electronic switches, a seventh resistor, an eighth resistor, and a ninth resistor, a first end of the third electronic switch is coupled to the third end of the first electronic switch through the seventh resistor, a second end of the third electronic switch is grounded, a third end of the third electronic switch is coupled to a first end of the fourth electronic switch through the eighth resistor, the first end of the fourth electronic switch is coupled to the input terminal of the power circuit through the ninth resistor, a second end of the fourth electronic switch is coupled to the input terminal of the power circuit, and a third end of the electronic switch is coupled to the output terminal of the power circuit.

6. The power circuit of claim 5, wherein the third switch unit further comprises a first capacitor, the first capacitor and the ninth resistor coupled in parallel.

7. The power circuit of claim 5, wherein the voltage transform unit comprises a pulse-width modulation (PWM) chip, a fourth electronic switch, a fifth electronic switch, a tenth resistor, a eleventh resistor, a twelfth resistor, a second capacitor, a third capacitor, and a fourth capacitor a power pin of the PWM chip is coupled to the input terminal of the power circuit, an enable pin of the PWM chip is coupled the output of the second switch unit, a bootstrap pin of the PWM chip is coupled a phase pin of the PWM chip through the tenth resistor and the second capacitor, a high level driving pin of the PWM chip is coupled to a first end of the fifth electronic switch, and is coupled to a first end of the sixth electronic switch, a second end of the fifth electronic switch is coupled to a third end of the sixth electronic switch, a third end of the fifth electronic switch is coupled to the input terminal of the power circuit, and is grounded through the third capacitor; a second end of the sixth electronic switch is grounded, the phase pin of the PWM chip is grounded through the inductor and the eleventh and twelfth resistors, and is grounded through the inductor and the fourth capacitor, a feedback pin of the PWM chip is coupled to a node between the eleventh and twelfth resistors, and a node between the inductor and the fourth capacitor is coupled to the output terminal of the power circuit.

8. The power circuit of claim 7, wherein the voltage transform unit further comprises a diode, an anode of the diode is coupled to a voltage pin of the PWM chip, and a cathode of the diode is coupled to the bootstrap pin of the PWM chip.

9. The power circuit of claim 8, wherein the first and second electronic switches, and the fourth to sixth electronic switches are n-channel metal oxide semiconductor field-effect transistors (MOSFETs), the first to third ends of each electronic switch correspond to a gate, a source, and a drain of the MOSFET, respectively; the third electronic switch is a NPN bipolar junction transistor (BJT), the first to third ends of the third electronic switch correspond to a base, an emitter, and a collector of the NPN BJT.

10. An electronic device comprising a power circuit, the power circuit comprising:
   an input terminal receiving a first voltage or a second voltage;
   an output terminal;
   a first switch unit, a second switch unit, and a third switch unit;
   a control unit comprising a voltage division unit coupled to the input terminal and the first switch unit, the second switch unit, and the third switch unit, the voltage division unit receiving the first voltage or the second voltage and outputting a divided voltage to the first switch unit, the first switch unit controlling the second switch unit to output a first drive signal or a second drive signal, and controlling the third switch unit to turn on/off, the third switch unit coupled between the input terminal and the output terminal; and
   a voltage transform unit coupled between the input terminal and the output terminal, and coupled to the second switch unit of the control unit;
   wherein when the input terminal receives the first voltage, the first switch unit is turned on, the third switch unit is turned off, the second switch unit outputs the first drive signal to the voltage transform unit, the voltage transform unit transforms the first voltage to an output voltage, and the output voltage is output by the output terminal;
   when the input terminal receives the second voltage, the first switch unit is turned off, the third switch unit is turned on, the second switch unit outputs the second drive signal to the voltage transform unit, the voltage transform unit cannot operate, and the second voltage from the input terminal is output by the output terminal through the third switch unit.

* * * * *